(12) United States Patent
Ritenour

(10) Patent No.: US 9,917,080 B2
(45) Date of Patent: Mar. 13, 2018

(54) SEMICONDUCTOR DEVICE WITH ELECTRICAL OVERSTRESS (EOS) PROTECTION

(71) Applicant: RF Micro Devices, Inc., Greensboro, NC (US)

(72) Inventor: Andrew P. Ritenour, Colfax, NC (US)

(73) Assignee: Qorvo US. Inc., Greensboro, NC (US)

( * ) Notice: Subject to any disclaimer, the term of this patent is extended or adjusted under 35 U.S.C. 154(b) by 23 days.

(21) Appl. No.: 13/871,526

(22) Filed: Apr. 26, 2013

(65) Prior Publication Data

US 2014/0054596 A1   Feb. 27, 2014

Related U.S. Application Data

(60) Provisional application No. 61/692,763, filed on Aug. 24, 2012, provisional application No. 61/702,879, filed on Sep. 19, 2012.

(51) Int. Cl.
*H01L 29/66* (2006.01)
*H01L 27/06* (2006.01)
(Continued)

(52) U.S. Cl.
CPC ...... *H01L 27/0629* (2013.01); *H01L 27/0248* (2013.01); *H01L 29/2003* (2013.01); *H01L 29/778* (2013.01)

(58) Field of Classification Search
CPC ............. H01L 27/0262; H01L 27/0255; H01L 27/0266; H01L 29/87; H01L 29/2003; H01L 27/0248; H01L 27/0292
(Continued)

(56) References Cited

U.S. PATENT DOCUMENTS

| | | | |
|---|---|---|---|
| 4,236,119 A | 11/1980 | Battjes | |
| 4,317,055 A | 2/1982 | Yoshida et al. | |

(Continued)

FOREIGN PATENT DOCUMENTS

| | | |
|---|---|---|
| EP | 1187229 A1 | 3/2002 |
| EP | 1826041 A1 | 8/2007 |

(Continued)

OTHER PUBLICATIONS

Non-Final Office Action for U.S. Appl. No. 13/927,182, dated May 1, 2014, 7 pages.
(Continued)

*Primary Examiner* — Lex Malsawma
*Assistant Examiner* — Eric W Jones
(74) *Attorney, Agent, or Firm* — Withrow & Terranova, P.L.L.C.

(57) ABSTRACT

A semiconductor device with electrical overstress (EOS) protection is disclosed. The semiconductor device includes a semi-insulating layer, a first contact disposed onto the semi-insulating layer, and a second contact disposed onto the semi-insulating layer. A passivation layer is disposed onto the semi-insulating layer. The passivation layer has a dielectric strength that is greater than that of the semi-insulating layer to ensure that a voltage breakdown occurs within the semi-insulating layer within a semi-insulating region between the first contact and the second contact before a voltage breakdown can occur in the passivation layer.

21 Claims, 8 Drawing Sheets

(51) Int. Cl.
*H01L 27/02* (2006.01)
*H01L 29/778* (2006.01)
*H01L 29/20* (2006.01)

(58) Field of Classification Search
USPC .......................................... 257/194, 173, 174
See application file for complete search history.

(56) References Cited

U.S. PATENT DOCUMENTS

| | | | |
|---|---|---|---|
| 4,540,954 A | 9/1985 | Apel | |
| 4,543,535 A | 9/1985 | Ayasli | |
| 4,620,207 A | 10/1986 | Calviello | |
| 4,788,511 A | 11/1988 | Schindler | |
| 5,028,879 A | 7/1991 | Kim | |
| 5,046,155 A | 9/1991 | Beyer et al. | |
| 5,047,355 A | 9/1991 | Huber et al. | |
| 5,107,323 A * | 4/1992 | Knolle et al. ................... | 257/636 |
| 5,118,993 A | 6/1992 | Yang | |
| 5,208,547 A | 5/1993 | Schindler | |
| 5,227,734 A | 7/1993 | Schindler et al. | |
| 5,306,656 A | 4/1994 | Williams et al. | |
| 5,361,038 A | 11/1994 | Allen et al. | |
| 5,365,197 A | 11/1994 | Ikalainen | |
| 5,389,571 A | 2/1995 | Takeuchi et al. | |
| 5,406,111 A * | 4/1995 | Sun ..................... | H01L 27/0251 |
| | | | 257/497 |
| 5,414,387 A | 5/1995 | Nakahara et al. | |
| 5,485,118 A | 1/1996 | Chick | |
| 5,608,353 A | 3/1997 | Pratt | |
| 5,629,648 A | 5/1997 | Pratt | |
| 5,698,870 A | 12/1997 | Nakano et al. | |
| 5,742,205 A | 4/1998 | Cowen et al. | |
| 5,764,673 A | 6/1998 | Kawazu et al. | |
| 5,834,326 A | 11/1998 | Miyachi et al. | |
| 5,843,590 A | 12/1998 | Miura et al. | |
| 5,864,156 A | 1/1999 | Juengling | |
| 5,874,747 A | 2/1999 | Redwing et al. | |
| 5,880,640 A | 3/1999 | Dueme | |
| 5,914,501 A | 6/1999 | Antle et al. | |
| 5,949,140 A | 9/1999 | Nishi et al. | |
| 6,049,250 A | 4/2000 | Kintis et al. | |
| 6,064,082 A | 5/2000 | Kawai et al. | |
| 6,110,757 A | 8/2000 | Udagawa et al. | |
| 6,130,579 A | 10/2000 | Iyer et al. | |
| 6,133,589 A | 10/2000 | Krames et al. | |
| 6,177,685 B1 | 1/2001 | Teraguchi et al. | |
| 6,191,656 B1 | 2/2001 | Nadler | |
| 6,229,395 B1 | 5/2001 | Kay | |
| 6,265,943 B1 | 7/2001 | Dening et al. | |
| 6,271,727 B1 | 8/2001 | Schmukler | |
| 6,285,239 B1 | 9/2001 | Iyer et al. | |
| 6,306,709 B1 | 10/2001 | Miyagi et al. | |
| 6,307,364 B1 | 10/2001 | Augustine | |
| 6,313,705 B1 | 11/2001 | Dening et al. | |
| 6,329,809 B1 | 12/2001 | Dening et al. | |
| 6,333,677 B1 | 12/2001 | Dening | |
| 6,342,815 B1 | 1/2002 | Kobayashi | |
| 6,356,150 B1 | 3/2002 | Spears et al. | |
| 6,369,656 B2 | 4/2002 | Dening et al. | |
| 6,369,657 B2 | 4/2002 | Dening et al. | |
| 6,373,318 B1 | 4/2002 | Dohnke et al. | |
| 6,376,864 B1 | 4/2002 | Wang | |
| 6,377,125 B1 | 4/2002 | Pavio et al. | |
| 6,384,433 B1 | 5/2002 | Barratt et al. | |
| 6,387,733 B1 | 5/2002 | Holyoak et al. | |
| 6,392,487 B1 | 5/2002 | Alexanian | |
| 6,400,226 B2 | 6/2002 | Sato | |
| 6,404,287 B2 | 6/2002 | Dening et al. | |
| 6,448,793 B1 | 9/2002 | Barratt et al. | |
| 6,455,877 B1 | 9/2002 | Ogawa et al. | |
| 6,455,925 B1 | 9/2002 | Laureanti | |
| 6,475,916 B1 | 11/2002 | Lee et al. | |
| 6,477,682 B2 | 11/2002 | Cypher | |
| 6,521,998 B1 | 2/2003 | Teraguchi et al. | |
| 6,525,611 B1 | 2/2003 | Dening et al. | |
| 6,528,983 B1 | 3/2003 | Augustine | |
| 6,560,452 B1 | 5/2003 | Shealy | |
| 6,566,963 B1 | 5/2003 | Yan et al. | |
| 6,589,877 B1 | 7/2003 | Thakur | |
| 6,593,597 B2 | 7/2003 | Sheu | |
| 6,608,367 B1 | 8/2003 | Gibson et al. | |
| 6,614,281 B1 | 9/2003 | Baudelot et al. | |
| 6,621,140 B1 | 9/2003 | Gibson et al. | |
| 6,624,452 B2 | 9/2003 | Yu et al. | |
| 6,627,552 B1 | 9/2003 | Nishio et al. | |
| 6,633,073 B2 | 10/2003 | Rezvani et al. | |
| 6,633,195 B2 | 10/2003 | Baudelot et al. | |
| 6,639,470 B1 | 10/2003 | Andrys et al. | |
| 6,656,271 B2 | 12/2003 | Yonehara et al. | |
| 6,657,592 B2 | 12/2003 | Dening et al. | |
| 6,660,606 B2 | 12/2003 | Miyabayashi et al. | |
| 6,701,134 B1 | 3/2004 | Epperson | |
| 6,701,138 B2 | 3/2004 | Epperson et al. | |
| 6,706,576 B1 | 3/2004 | Ngo et al. | |
| 6,720,831 B2 | 4/2004 | Dening et al. | |
| 6,723,587 B2 | 4/2004 | Cho et al. | |
| 6,724,252 B2 | 4/2004 | Ngo et al. | |
| 6,727,762 B1 | 4/2004 | Kobayashi | |
| 6,748,204 B1 | 6/2004 | Razavi et al. | |
| 6,750,158 B2 | 6/2004 | Ogawa et al. | |
| 6,750,482 B2 | 6/2004 | Seaford et al. | |
| 6,759,907 B2 | 7/2004 | Orr et al. | |
| 6,802,902 B2 | 10/2004 | Beaumont et al. | |
| 6,815,722 B2 | 11/2004 | Lai et al. | |
| 6,815,730 B2 | 11/2004 | Yamada | |
| 6,822,842 B2 | 11/2004 | Friedrichs et al. | |
| 6,861,677 B2 | 3/2005 | Chen | |
| 6,943,631 B2 | 9/2005 | Scherrer et al. | |
| 7,015,512 B2 | 3/2006 | Park et al. | |
| 7,026,665 B1 | 4/2006 | Smart et al. | |
| 7,033,961 B1 | 4/2006 | Smart et al. | |
| 7,042,150 B2 | 5/2006 | Yasuda | |
| 7,052,942 B1 | 5/2006 | Smart et al. | |
| 7,135,747 B2 | 11/2006 | Allen et al. | |
| 7,211,822 B2 | 5/2007 | Nagahama et al. | |
| 7,408,182 B1 | 8/2008 | Smart et al. | |
| 7,449,762 B1 | 11/2008 | Singh | |
| 7,459,356 B1 | 12/2008 | Smart et al. | |
| 7,557,421 B1 | 7/2009 | Shealy et al. | |
| 7,719,055 B1 | 5/2010 | McNutt et al. | |
| 7,768,758 B2 | 8/2010 | Maier et al. | |
| 7,804,262 B2 | 9/2010 | Schuster et al. | |
| 7,923,826 B2 | 4/2011 | Takahashi et al. | |
| 7,935,983 B2 | 5/2011 | Saito et al. | |
| 7,968,391 B1 | 6/2011 | Smart et al. | |
| 7,974,322 B2 | 7/2011 | Ueda et al. | |
| 8,017,981 B2 | 9/2011 | Sankin et al. | |
| 8,110,915 B2 | 2/2012 | Fowlkes et al. | |
| 8,237,198 B2 * | 8/2012 | Wu ..................... | H01L 29/2003 |
| | | | 257/183 |
| 8,405,068 B2 | 3/2013 | O'Keefe | |
| 8,502,258 B2 | 8/2013 | O'Keefe | |
| 8,530,978 B1 * | 9/2013 | Chu ..................... | H01L 29/402 |
| | | | 257/192 |
| 8,633,518 B2 | 1/2014 | Suh et al. | |
| 8,692,294 B2 | 4/2014 | Chu et al. | |
| 8,729,680 B2 | 5/2014 | Kobayashi et al. | |
| 8,785,976 B2 | 7/2014 | Nakajima et al. | |
| 8,937,338 B2 * | 1/2015 | Chowdhury ...... | H01L 29/66204 |
| | | | 257/194 |
| 9,082,836 B2 * | 7/2015 | Senda ..................... | H01L 29/78 |
| 2001/0040246 A1 | 11/2001 | Ishii | |
| 2001/0054848 A1 | 12/2001 | Baudelot et al. | |
| 2002/0005528 A1 * | 1/2002 | Nagahara .......... | H01L 21/28593 |
| | | | 257/189 |
| 2002/0031851 A1 | 3/2002 | Linthicum et al. | |
| 2002/0048302 A1 | 4/2002 | Kimura | |
| 2002/0079508 A1 | 6/2002 | Yoshida | |
| 2003/0003630 A1 | 1/2003 | Iimura et al. | |
| 2003/0122139 A1 | 7/2003 | Meng et al. | |
| 2003/0160307 A1 | 8/2003 | Gibson et al. | |
| 2003/0160317 A1 | 8/2003 | Sakamoto et al. | |
| 2003/0206440 A1 | 11/2003 | Wong | |
| 2003/0209730 A1 | 11/2003 | Gibson et al. | |

(56) References Cited

U.S. PATENT DOCUMENTS

| | | |
|---|---|---|
| 2003/0218183 A1 | 11/2003 | Micovic et al. |
| 2004/0070003 A1 | 4/2004 | Gaska et al. |
| 2004/0130037 A1 | 7/2004 | Mishra et al. |
| 2004/0144991 A1* | 7/2004 | Kikkawa .............. H01L 29/2003 257/103 |
| 2004/0227211 A1* | 11/2004 | Saito ................... H01L 27/0605 257/578 |
| 2004/0241916 A1 | 12/2004 | Chau et al. |
| 2005/0006639 A1* | 1/2005 | Dupuis .............. H01L 21/02378 257/20 |
| 2005/0110042 A1* | 5/2005 | Saito .................... H01L 29/402 257/192 |
| 2005/0121730 A1* | 6/2005 | Asano ................ H01L 27/0248 257/376 |
| 2005/0139868 A1 | 6/2005 | Anda |
| 2005/0145874 A1* | 7/2005 | Saxler ............... H01L 21/02378 257/103 |
| 2005/0189559 A1* | 9/2005 | Saito .................. H01L 29/1066 257/189 |
| 2005/0189562 A1 | 9/2005 | Kinzer et al. |
| 2005/0194612 A1 | 9/2005 | Beach |
| 2005/0212049 A1* | 9/2005 | Onodera ....................... 257/355 |
| 2005/0225912 A1* | 10/2005 | Pant et al. ........................ 361/56 |
| 2005/0271107 A1 | 12/2005 | Murakami et al. |
| 2005/0274977 A1* | 12/2005 | Saito .................. H01L 27/0605 257/192 |
| 2006/0003556 A1* | 1/2006 | Lee ................... H01L 21/0242 438/483 |
| 2006/0043385 A1 | 3/2006 | Wang et al. |
| 2006/0043501 A1* | 3/2006 | Saito .................. H01L 29/0692 257/401 |
| 2006/0054924 A1* | 3/2006 | Saito .................. H01L 29/7787 257/192 |
| 2006/0068601 A1 | 3/2006 | Lee et al. |
| 2006/0124960 A1 | 6/2006 | Hirose et al. |
| 2006/0205161 A1 | 9/2006 | Das et al. |
| 2006/0243988 A1 | 11/2006 | Narukawa et al. |
| 2006/0244010 A1* | 11/2006 | Saxler ................ H01L 29/7783 257/194 |
| 2006/0246680 A1 | 11/2006 | Bhattacharyya |
| 2006/0249750 A1* | 11/2006 | Johnson ............ H01L 21/28587 257/192 |
| 2006/0255377 A1* | 11/2006 | Tu ........................ H01L 29/402 257/280 |
| 2007/0026676 A1 | 2/2007 | Li et al. |
| 2007/0093009 A1 | 4/2007 | Baptist et al. |
| 2007/0138545 A1* | 6/2007 | Lin .................. H01L 27/10876 257/330 |
| 2007/0158692 A1* | 7/2007 | Nakayama .......... H01L 29/4236 257/213 |
| 2007/0164326 A1* | 7/2007 | Okamoto ............ H01L 29/7787 257/288 |
| 2007/0205433 A1* | 9/2007 | Parikh ................. H01L 29/518 257/192 |
| 2007/0295985 A1 | 12/2007 | Weeks, Jr. et al. |
| 2008/0023706 A1 | 1/2008 | Saito et al. |
| 2008/0073752 A1 | 3/2008 | Asai et al. |
| 2008/0079023 A1* | 4/2008 | Hikita ................ H01L 29/1066 257/192 |
| 2008/0112448 A1 | 5/2008 | Ueda et al. |
| 2008/0121875 A1 | 5/2008 | Kim |
| 2008/0142837 A1 | 6/2008 | Sato et al. |
| 2008/0179737 A1 | 7/2008 | Haga et al. |
| 2008/0190355 A1 | 8/2008 | Chen et al. |
| 2008/0217753 A1 | 9/2008 | Otani |
| 2008/0272382 A1 | 11/2008 | Kim et al. |
| 2008/0272422 A1 | 11/2008 | Min |
| 2008/0283821 A1 | 11/2008 | Park et al. |
| 2008/0296618 A1* | 12/2008 | Suh .................... H01L 29/1066 257/190 |
| 2008/0308813 A1 | 12/2008 | Suh et al. |
| 2009/0072269 A1 | 3/2009 | Suh et al. |
| 2009/0090984 A1* | 4/2009 | Khan et al. ....................... 257/409 |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2009/0200576 A1* | 8/2009 | Saito ................... H01L 29/7787 257/194 |
| 2009/0267078 A1* | 10/2009 | Mishra ................ H01L 29/2003 257/76 |
| 2009/0273002 A1 | 11/2009 | Chiou et al. |
| 2009/0278137 A1 | 11/2009 | Sheridan et al. |
| 2010/0025657 A1 | 2/2010 | Nagahama et al. |
| 2010/0025737 A1 | 2/2010 | Ishikura |
| 2010/0109018 A1* | 5/2010 | Chen .................... C30B 25/183 257/76 |
| 2010/0133567 A1 | 6/2010 | Son |
| 2010/0187575 A1 | 7/2010 | Baumgartner et al. |
| 2010/0207164 A1* | 8/2010 | Shibata et al. ................. 257/192 |
| 2010/0230656 A1 | 9/2010 | O'Keefe |
| 2010/0230717 A1 | 9/2010 | Saito |
| 2010/0258898 A1 | 10/2010 | Lahreche |
| 2011/0017972 A1 | 1/2011 | O'Keefe |
| 2011/0025422 A1 | 2/2011 | Marra et al. |
| 2011/0031633 A1 | 2/2011 | Hsu et al. |
| 2011/0079771 A1* | 4/2011 | Kanamura ............ H01L 29/778 257/24 |
| 2011/0095337 A1* | 4/2011 | Sato .............................. 257/194 |
| 2011/0101300 A1 | 5/2011 | O'Keefe |
| 2011/0115025 A1 | 5/2011 | Okamoto |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1 | 12/2011 | Leonard et al. |
| 2012/0018735 A1 | 1/2012 | Ishii |
| 2012/0086497 A1 | 4/2012 | Vorhaus |
| 2012/0126240 A1 | 5/2012 | Won |
| 2012/0199875 A1 | 8/2012 | Bhalla et al. |
| 2012/0199955 A1 | 8/2012 | Sun |
| 2012/0211802 A1 | 8/2012 | Tamari |
| 2012/0218783 A1 | 8/2012 | Imada |
| 2012/0262220 A1 | 10/2012 | Springett |
| 2013/0032897 A1 | 2/2013 | Narayanan et al. |
| 2013/0277687 A1 | 10/2013 | Kobayashi et al. |
| 2013/0280877 A1 | 10/2013 | Kobayashi et al. |
| 2014/0117559 A1 | 5/2014 | Zimmerman et al. |
| 2014/0264266 A1 | 9/2014 | Li et al. |
| 2014/0264454 A1 | 9/2014 | Banerjee et al. |

FOREIGN PATENT DOCUMENTS

| | | |
|---|---|---|
| JP | 10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Non-Final Office Action for U.S. Appl. No. 13/973,482, dated May 23, 2014, 8 pages.

Non-Final Office Action for U.S. Appl. No. 13/795,986, dated Apr. 24, 2014, 13 pages.

Chang, S.J. et al., "Improved ESD protection by combining InGaN—GaN MQW LEDs with GaN Schottky diodes," IEEE Electron Device Letters, Mar. 2003, vol. 24, No. 3, pp. 129-131.

Chao, C-H., et al., "Theoretical demonstration of enhancement of light extraction of flip-chip GaN light-emitting diodes with photonic crystals," Applied Physics Letters, vol. 89, 2006, 4 pages.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

(56) References Cited

OTHER PUBLICATIONS

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.
Hibbard, D.L. et al., "Low Resistance High Reflectance Contacts to p-GaN Using Oxidized Ni/Au and Al or Ag," Applied Physics Letters, vol. 83 No. 2, Jul. 14, 2003, pp. 311-313.
Lee, S.J., "Study of photon extraction efficiency in InGaN light-emitting diodes depending on chip structures and chip-mount schemes," Optical Engineering, SPIE, Jan. 2006, vol. 45, No. 1, 14 pages.
Shchekin, O.B. et al., "High performance thin-film flip-chip InGaN—GaN light-emitting diodes," Applied Physics Letters, vol. 89, 071109, Aug. 2006, 4 pages.
Wierer, J. et al., "High-power AlGaInN flip-chip light-emitting diodes," Applied Physics Letters, vol. 78 No. 22, May 28, 2001, pp. 3379-3381.
Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.
Windisch, R. et al., "Impact of texture-enhanced transmission on high-efficiency surface-textured light-emitting diodes," Applied Physics Letters, Oct. 8, 2001, vol. 79, No. 15, pp. 2315-2317.
Advisory Action for U.S. Appl. No. 10/620,205, dated Feb. 15, 2005, 2 pages.
Final Office Action for U.S. Appl. No. 10/620,205, dated Dec. 16, 2004, 9 pages.
Non-Final Office Action for U.S. Appl. No. 10/620,205, dated Jul. 23, 2004, 7 pages.
Non-Final Office Action for U.S. Appl. No. 10/620,205, dated May 3, 2005, 10 pages.
Notice of Allowance for U.S. Appl. No. 10/620,205, dated Dec. 8, 2005, 4 pages.
Non-Final Office Action for U.S. Appl. No. 10/689,980, dated Jan. 26, 2005, 7 pages.
Non-Final Office Action for U.S. Appl. No. 10/689,980, dated May 12, 2005, 8 pages.
Non-Final Office Action for U.S. Appl. No. 12/841,225, dated Dec. 22, 2011, 8 pages.
Non-Final Office Action for U.S. Appl. No. 11/397,279, dated Oct. 31, 2007, 7 pages.
Notice of Allowance for U.S. Appl. No. 11/397,279, dated Apr. 17, 2008, 7 pages.
Final Office Action for U.S. Appl. No. 10/689,979, dated Jun. 29, 2005, 16 pages.
Non-Final Office Action for U.S. Appl. No. 10/689,979, dated Jan. 11, 2005, 14 pages.
Notice of Allowance for U.S. Appl. No. 10/689,979, dated Oct. 26, 2005, 6 pages.
Notice of Allowance for U.S. Appl. No. 12/841,225, dated Nov. 9, 2012, 5 pages.
Non-Final Office Action for U.S. Appl. No. 11/360,734, dated Jan. 18, 2008, 10 pages.
Notice of Allowance for U.S. Appl. No. 11/360,734, dated Aug. 7, 2008, 6 pages.
Non-Final Office Action for U.S. Appl. No. 12/841,257 dated Jan. 5, 2012, 13 pages.
Advisory Action for U.S. Appl. No. 11/937,207, dated Feb. 2, 2010, 2 pages.
Final Office Action for U.S. Appl. No. 11/937,207, dated Nov. 19, 2009, 9 pages.
Non-Final Office Action for U.S. Appl. No. 11/937,207, dated Mar. 18, 2010, 10 pages.
Non-Final Office Action for U.S. Appl. No. 11/937,207, dated May 29, 2009, 11 pages.
Notice of Allowance for U.S. Appl. No. 11/937,207, dated Feb. 28, 2011, 8 pages.
Quayle Action for U.S. Appl. No. 11/937,207, dated Nov. 24, 2010, 4 pages.
Final Office Action for U.S. Appl. No. 11/458,833, dated Dec. 15, 2008, 13 pages.
Non-Final Office Action for U.S. Appl. No. 11/458,833, dated Apr. 1, 2008, 10 pages.
Notice of Allowance for U.S. Appl. No. 11/458,833, dated Mar. 9, 2009, 7 pages.
Invitation to Pay Fees for PCT/US2013/056105, dated Nov. 5, 2013, 7 pages.
International Search Report and Written Opinion for PCT/US2013/056126, dated Oct. 25, 2013, 10 pages.
International Search Report and Written Opinion for PCT/US2013/056132, dated Oct. 10, 2013, 11 pages.
International Search Report and Written Opinion for PCT/US2013/056187, dated Oct. 10, 2013, 11 pages.
International Search Report for GB0902558.6, dated Jun. 15, 2010, by the UK Intellectual Property Office, 2 pages.
Examination Report for British Patent Application No. 0902558.6, dated Nov. 16, 2012, 5 pages.
Examination Report for British Patent Application No. GB0902558.6, dated Feb. 28, 2013, 2 pages.
Non-Final Office Action for U.S. Appl. No. 12/705,869, dated Feb. 9, 2012, 10 pages.
Notice of Allowance for U.S. Appl. No. 12/705,869, dated Apr. 4, 2013, 9 pages.
Notice of Allowance for U.S. Appl. No. 12/705,869, dated Jul. 19, 2012, 8 pages.
Advisory Action for U.S. Appl. No. 12/841,225, dated Apr. 16, 2012, 3 pages.
Final Office Action for U.S. Appl. No. 12/841,225 dated Feb. 1, 2012, 9 pages.
Non-Final Office Action for U.S. Appl. No. 12/841,225, dated May 2, 2012, 10 pages.
International Search Report and Written Opinion for PCT/US2013/056105, dated Feb. 12, 2014, 15 pages.
Non-Final Office Action for U.S. Appl. No. 13/910,202, dated Sep. 25, 2014, 9 pages.
Final Office Action for U.S. Appl. No. 13/927,182, dated Sep. 17, 2014, 10 pages.
Non-Final Office Action for U.S. Appl. No. 13/974,488, dated Oct. 28, 2014, 8 pages.
Non-Final Office Action for U.S. Appl. No. 13/966,400, dated Sep. 3, 2014, 9 pages.
Non-Final Office Action for U.S. Appl. No. 13/957,698, dated Nov. 5, 2014, 11 pages.
Final Office Action for U.S. Appl. No. 13/973,482, dated Nov. 5, 2014, 9 pages.
Advisory Action for U.S. Appl. No. 13/910,202, dated Apr. 6, 2015, 3 pages.
Final Office Action for U.S. Appl. No. 13/974,488, dated Feb. 20, 2015, 8 pages.
Notice of Allowance for U.S. Appl. No. 13/966,400, dated Feb. 20, 2015, 8 pages.
Notice of Allowance for U.S. Appl. No. 13/957,698, dated Mar. 30, 2015, 7 pages.
Notice of Allowance for U.S. Appl. No. 13/795,986, dated Mar. 6, 2015, 8 pages.
Non-Final Office Action for U.S. Appl. No. 14/067,019, dated Mar. 25, 2015, 7 pages.
Boutros, K.S., et al., "5W GaN MMIC for Millimeter-Wave Applications," 2006 Compound Semiconductor Integrated Circuit Symposium, Nov. 2006, pp. 93-95.
Cho, H., et al., "High Density Plasma via Hole Etching in SiC," Journal of Vacuum Science & Technology A: Surfaces, and Films, vol. 19, No. 4, Jul./Aug. 2001, pp. 1878-1881.
Darwish, A.M., et al., "Dependence of GaN HEMT Millimeter-Wave Performance on Temperature," IEEE Transactions on Microwave Theory and Techniques, vol. 57, No. 12, Dec. 2009, pp. 3205-3211.
Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.

(56) References Cited

OTHER PUBLICATIONS

Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.
Non-Final Office Action for U.S. Appl. No. 13/795,926, dated Dec. 19, 2014, 14 pages.
Non-Final Office Action for U.S. Appl. No. 13/942,998, dated Nov. 19, 2014, 9 pages.
Final Office Action for U.S. Appl. No. 13/910,202, dated Jan. 20, 2015, 10 pages.
Notice of Allowance for U.S. Appl. No. 13/914,060, dated Nov. 13, 2014, 8 pages.
Final Office Action for U.S. Appl. No. 13/966,400, dated Dec. 3, 2014, 8 pages.
Final Office Action for U.S. Appl. No. 13/795,986, dated Dec. 5, 2014, 16 pages.
Author Unknown, "CGHV1J006D: 6 W, 18.0 GHz, GaN HEMT Die," Cree, Inc., 2014, 9 pages.
International Preliminary Report on Patentability for PCT/US2013/056105, dated Mar. 5, 2015, 12 pages.
International Preliminary Report on Patentability for PCT/US2013/056126, dated Mar. 5, 2015, 7 pages.
International Preliminary Report on Patentability for PCT/US2013/056132, dated Mar. 5, 2015, 9 pages.
International Preliminary Report on Patentability for PCT/US2013/056187, dated Mar. 12, 2015, 9 pages.
Corrected/Supplemental Notice of Allowability for U.S. Appl. No. 13/957,698, dated Nov. 4, 2015, 4 pages.
Notice of Allowance for U.S. Appl. No. 13/957,698, dated Jul. 20, 2015, 7 pages.
Non-Final Office Action for U.S. Appl. No. 14/557,940, dated Aug. 31, 2015, 8 pages.
Notice of Allowance for U.S. Appl. No. 14/067,019, dated Oct. 13, 2015, 6 pages.
Notice of Allowance for U.S. Appl. No. 13/795,926, dated Apr. 27, 2015, 8 pages.
Notice of Allowance for U.S. Appl. No. 13/942,998, dated Apr. 27, 2015, 8 pages.
Notice of Allowance for U.S. Appl. No. 13/910,202, dated May 14, 2015, 9 pages.
Notice of Allowance for U.S. Appl. No. 13/974,488, dated May 29, 2015, 9 pages.
Corrected/Supplemental Notice of Allowability for U.S. Appl. No. 13/957,689, dated May 20, 2015, 3 pages.
Corrected/Supplement Notice of Allowability for U.S. Appl. No. 13/957,689, dated Jun. 9, 2015, 4 pages.
Notice of Allowance for U.S. Appl. No. 13/973,482, dated May 4, 2015, 7 pages.
Lin, C.K. et al., "GaN Lattice Matched ZnO/Pr$_2$O$_3$ Film as Gate Dielectric Oxide Layer for AlGaN/GaN HEMT," IEEE International Conference of Electron Devices and Solid-State Circuits, EDSSC 2009, IEEE, Dec. 25-27, 2009, Xi'an, China, pp. 408-411.
Lin, H. C. et al., "Leakage current and breakdown electric-field studies on ultrathin atomic-layer-deposited Al$_2$O$_3$ on GaAs," Applied Physics Letters, vol. 87, 2005, pp. 182094-1 to 182094-3.
Lossy, R. et al., "Gallium nitride MIS-HEMT using atomic layer deposited Al2O3 as gate dielectric," Journal of Vacuum Science & Technology A: Vacuum, Surfaces, and Films, vol. 31, No. 1, Jan./Feb. 2013, 6 pages.
Seok, O. et al., "High-breakdown voltage and low on-resistance AlGaN/GaN on Si MOS-HEMTs employing an extended Tan gate on HfO2 gate insulator," Electronics Letters, vol. 49, No. 6, Institute of Engineering and Technology, Mar. 14, 2013, 2 pages.
Tang, K. et al., "Enhancement-mode GaN Hybrid MOS-HEMTs with Breakdown Voltage of 1300V," 21st International Symposium on Power Semiconductor Devices & IC's, ISPSD 2009, IEEE, Jun. 14-18, 2009, Barcelona, Spain, pp. 279-282.
Ye, P.D., et al., "GaN MOS-HEMT Using Atomic Layer Deposition Al2O3 as Gate Dielectric and Surface Passivation," International Journal of High Speed Electronics and Systems, vol. 14, No. 3, 2004, pp. 791-796.
Non-Final Office Action for U.S. Appl. No. 14/749,274, dated Feb. 22, 2016, 6 pages.
Non-Final Office Action for U.S. Appl. No. 14/731,736, dated Jan. 14, 2016, 10 pages.
Final Office Action for U.S. Appl. No. 14/557,940, dated Feb. 8, 2016, 8 pages.
Huang, Xiucheng et al., "Analytical Loss Model of High Voltage GaN HEMT in Cascode Configuration," IEEE Transactions on Power Electronics, vol. 29, No. 5, May 2014, IEEE, pp. 2208-2219.
Lee, Han S., "GaN-on-Silicon-Based Power Switch in Sintered, Dual-Side Cooled Package," PowerElectronics.com, Jan. 2, 2013, 5 pages, http://powerelectronics.com/discrete-power-semis/gan-silicon-based-power-switch-sintered-package.
Liang, Zhenxian et al., "Embedded Power—An Integration Packaging Technology for IPEMs," The International Journal of Microcircuits and Electronic Packaging, vol. 23, No. 4, 2000, pp. 481-487.
Li, Xueqing et al., "Investigation of SiC Stack and Discrete Cascodes" PowerPoint Presentation, PCIM Europe, May 20-22, 2014, Nuremberg, Germany, 26 slides.
Stevanovic, Ljubisa D. et al., "Low Inductance Power Module with Blade Connector," 2010 Twenty-Fifth Annual IEEE Applied Power Electronics Conference and Exposition (APEC), Feb. 21-25, 2010, IEEE, Palm Springs, CA, pp. 1603-1609.
Liang, Zhenxian et al., "Embedded Power—A Multilayer Integration Technology for Packaging of IPEMs and PEBBs," Proceedings of International Workshop on Integrated Power Packaging, Jul. 14-16, 2000, IEEE, pp. 41-45.
Final Office Action for U.S. Appl. No. 14/749,274, dated Jun. 23, 2016, 6 pages.
Notice of Allowance for U.S. Appl. No. 14/731,736, dated May 9, 2016, 8 pages.
Notice of Allowance for U.S. Appl. No. 14/749,274, dated Aug. 15, 2016, 7 pages.
Non-Final Office Action for U.S. Appl. No. 14/797,573, dated Jul. 7, 2016, 8 pages.
Notice of Allowance for U.S. Appl. No. 14/847,558, dated Aug. 8, 2018, 9 pages.
Dogan, S. et al., "4H—SiC photoconductive switching devices for use in high-power applications," Applied Physics Letters, vol. 82, No. 18, May 5, 2003, pp. 3107-3109.
James, C. et al., "High Voltage Photoconductive Switches using Semi-Insulating, V anadium doped 6H—SiC," 2009 IEEE Pulsed Power Conference, Jun. 28, 2009, IEEE, pp. 283-286.
Sullivan, J. S. et al., "6H—SiC Photoconductive Switches Triggered at Below Bandgap Wavelengths," IEEE Transactions on Dielectrics and Electrical Insulation, vol. 14, No. 4, Aug. 2007, pp. 980-985.
Sun, M. G. et al., "Magnetic-field-controllable avalanche breakdown and giant magnetoresistive effects in Gold/semi-insulating-GaAs Schottky diode," Applied Physics Letters, vol. 85, No. 23, Dec. 6, 2004, pp. 5643-5645.
Notice of Allowance for U.S. Appl. No. 14/797,573, dated Dec. 20, 2016, 7 pages.

* cited by examiner

SEMICONDUCTOR DEVICE WITH ELECTRICAL OVERSTRESS (EOS) PROTECTION

RELATED APPLICATIONS

This application claims the benefit of U.S. Provisional Patent Applications No. 61/692,763, filed Aug. 24, 2012, and No. 61/702,879, filed Sep. 19, 2012; the disclosures of which are incorporated herein by reference in their entireties.

FIELD OF THE DISCLOSURE

The field of the present disclosure relates to electrical overstress (EOS) protection of semiconductor devices.

BACKGROUND

Increased ruggedness provides better performance in power conversion applications. In gallium nitride (GaN) transistors, and more specifically high electron mobility transistors (HEMTs), an application of an excessive voltage to a drain terminal of a GaN HEMT often results in destructive breakdown, thus GaN HEMTs are said to have limited "ruggedness." The ruggedness of GaN HEMTs may be limited by breakdown events in highly localized areas within semiconductor layers due to crystal defects and/or high electric field concentration. Therefore, a voltage-induced breakdown in the semiconductor or adjacent dielectric layers, and/or high current flow through a Schottky gate electrode during breakdown events usually results in device destruction. An EOS protection device is needed to prevent device destruction.

SUMMARY

The present disclosure provides a semiconductor device with electrical overstress (EOS) protection. The semiconductor device includes a semi-insulating layer, a first contact disposed onto the semi-insulating layer, and a second contact disposed onto the semi-insulating layer. A passivation layer is disposed onto the semi-insulating layer. The passivation layer has a dielectric strength that is greater than that of the semi-insulating layer to ensure that a voltage breakdown occurs within the semi-insulating layer within a semi-insulating region between the first contact and the second contact before a voltage breakdown can occur in the passivation layer.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures. Moreover, the term high resistivity and the term semi-insulating are used interchangeably throughout the disclosure.

Figure 1:
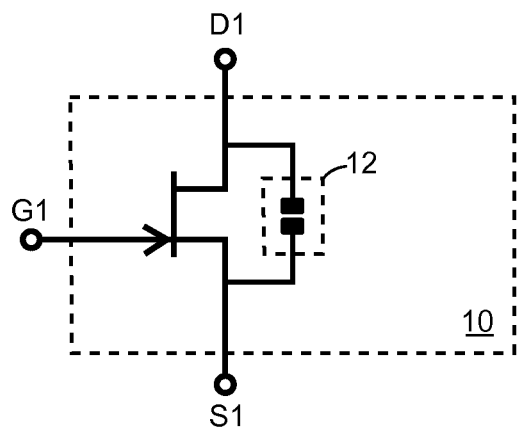
FIG. 1 depicts a semiconductor device in a first configuration that includes an electrical overstress (EOS) protection device coupled between a drain and a source.
Figure 2:
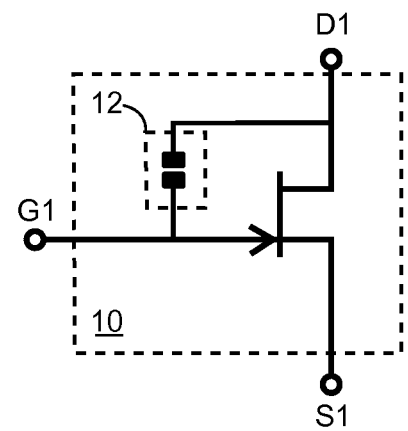
FIG. 2 depicts a second configuration in which the EOS protection device is coupled between the drain and a gate of the semiconductor device.

FIG. 1 depicts a semiconductor device 10 in a first configuration that includes an electrical overstress (EOS) protection device 12 coupled between a drain D1 and a source S1. For the purposes of this disclosure an EOS event includes, but is not limited to, power supply over voltages and electrostatic discharges. FIG. 2 depicts a second configuration in which the EOS protection device 12 is coupled between the drain D1 and a gate G1 of the semiconductor device 10. In either of the configurations depicted in FIGS. 1 and 2, the EOS protection device 12 enhances voltage breakdown ruggedness of the semiconductor device 10, which can be but is not limited to a Gallium Nitride (GaN) high electron mobility transistor (HEMT) or diode by avalanching, leaking, or breaking down before the semiconductor device 10 is damaged. For example, if a destructive voltage breakdown in the semiconductor device 10 would occur at around 900V, the EOS protection device 12 should avalanche at a voltage less than around 900V. An appropriate safety margin such as an exemplary range of 25V to 100V within the 900V breakdown voltage should be considered. The EOS protection device 12 is rugged and can withstand multiple avalanche/breakdown events since the EOS protection device 12 largely comprises a bulk semi-insulating material.

Figure 3:
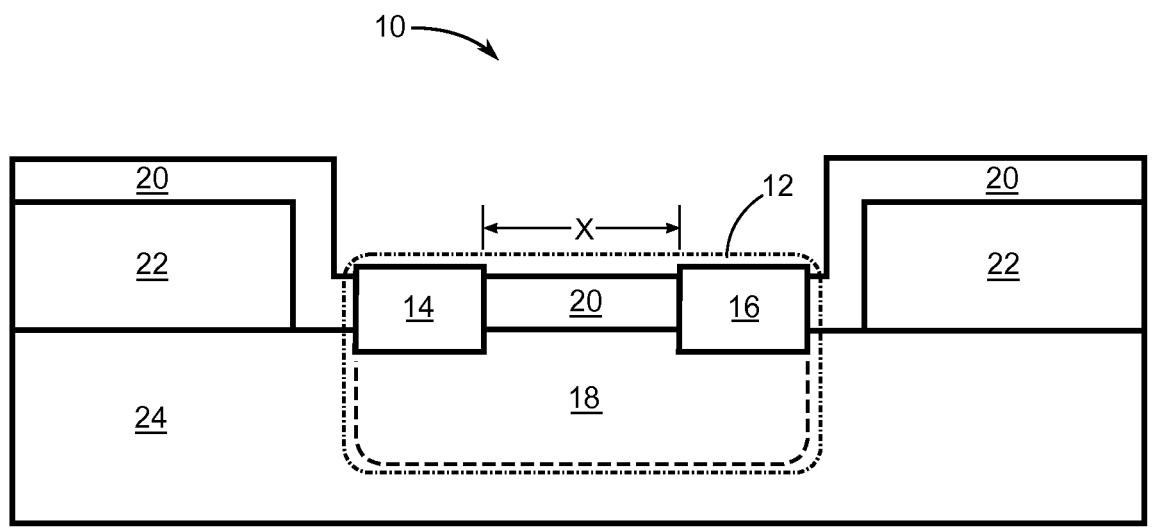
FIG. 3 is a cross-section structural diagram of a first embodiment of the semiconductor device having a first contact and a second contact separated by a semi-insulating region.

FIG. 3 is a cross-section structural diagram of a first embodiment of the semiconductor device 10 that has a first contact 14 and a second contact 16 separated by a semi-insulating region 18. Preferably, the EOS protection device 12 should comprise a high-quality bulk semiconductor that comprises the semi-insulating region 18 combined with the first contact 14 and the second contact 16. It is also preferred that the first contact 14 and the second contact 16 be ruggedized ohmic type contacts that are interfaced with the semi-insulating region 18. However, it is to be understood that either or both of the first contact 14 and the second contact 16 can be rectifying/Schottky type contacts. The semi-insulating region 18 may include, but is not limited to high resistivity silicon carbide (SiC), silicon (Si), gallium nitride (GaN), zinc oxide (ZnO), aluminum oxide ($Al_2O_3$), and gallium oxide ($Ga_2O_3$). A passivation layer 20 disposed on the surface of the semi-insulating region 18 has a dielectric strength that is greater than that of the semi-insulating region 18 to ensure that voltage breakdown occurs within the semi-insulating region 18 before voltage breakdown can occur in the passivation layer 20. An avalanche voltage value for the EOS protection device 12 is largely determined by a gap X between the first contact 14 and the second contact 16 along with electrical field characteristics of the semi-insulating region 18. The EOS protection device 12 in the first configuration shown in FIG. 1 may contribute to a leakage current from the drain D1 to the source S1 during an off-state of the semiconductor device 10. Moreover, the EOS protection device 12 in the second configuration shown in FIG. 2 may contribute to a leakage current from the drain D1 to the gate G1 during an off-state of the semiconductor device 10. However, the high resistivity of the semi-insulating region 18 results in current leakage values less than an intrinsic drain-to-source leakage of the semiconductor device 10. An epitaxial layer 22 is disposed onto a substrate 24 that includes the semi-insulating region 18. The epitaxial layer 22 is typically made of GaN and in this exemplary case the substrate 24 is made of the same material as the semi-insulating region 18.

Figure 4:
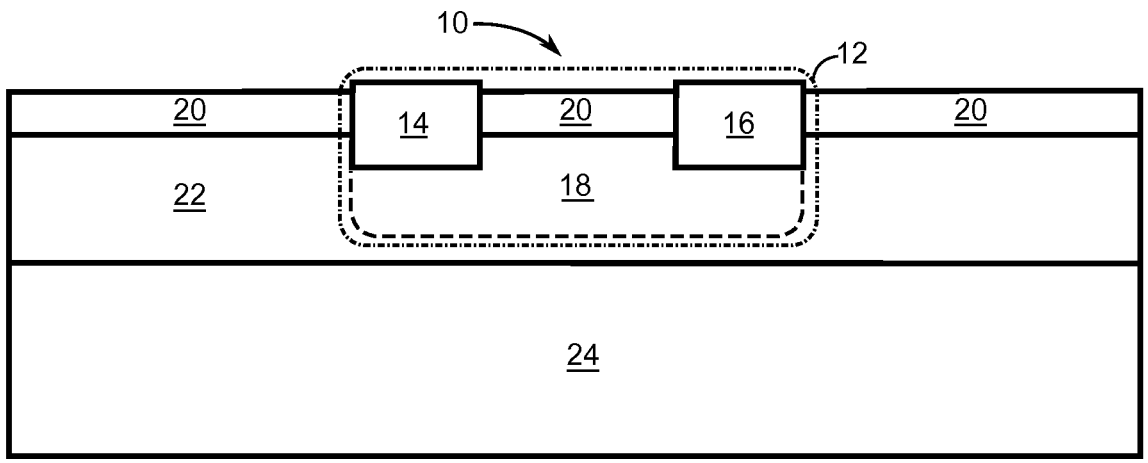
FIG. 4 is a cross-section structural diagram that depicts another embodiment in which the EOS protection device is formed in an epitaxial layer that has been disposed on a typical substrate.

FIG. 4 is a cross-section structural diagram that depicts another embodiment in which the EOS protection device 12 is formed in the epitaxial layer 22 that has been disposed on the substrate 24. The semi-insulating region 18 between the first contact 14 and the second contact 16 of the epitaxial layer 22 used for the EOS protection device 12 is a high resistivity material to prevent parasitic drain D1 to source S1 current leakage or drain D1 to gate G1 current leakage. The region between the first contact 14 and the second contact 16 of the epitaxial layer 22 is a high resistivity material as originally deposited and in this case the substrate 24 can be a general purpose silicon wafer substrate.

Figure 5:
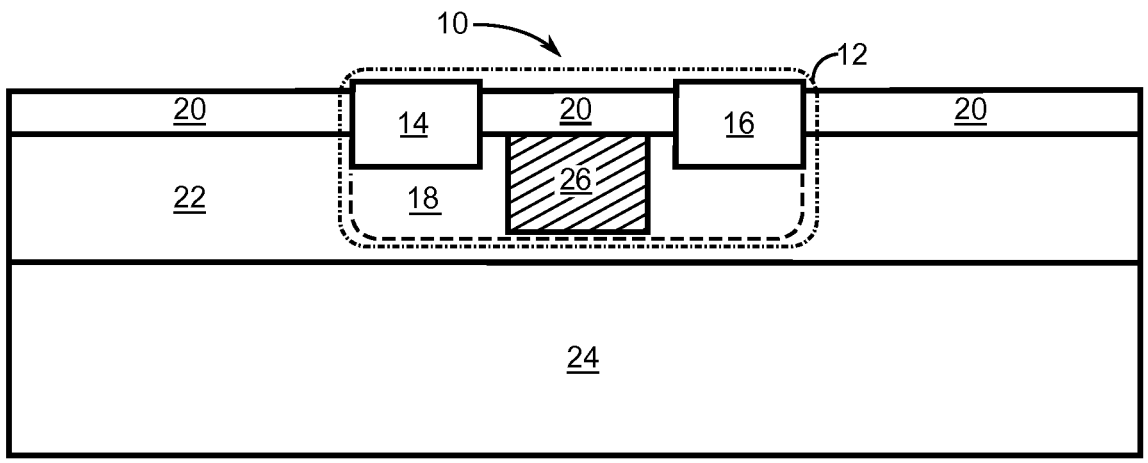
FIG. 5 is a cross-section structural diagram of the EOS protection device after using an ion implant process to convert a transformed region to a relatively higher resistivity material for increased isolation.
Figure 6:
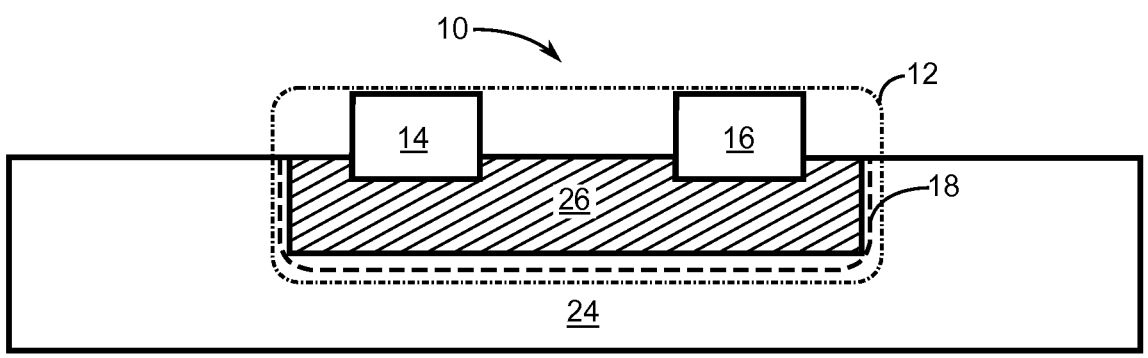
FIG. 6 is a cross-section structural diagram of the EOS protection device with the transformed region expanded to include areas beyond the first contact and the second contact.

In an alternative embodiment shown in FIG. 5, a transformed region 26 is converted into a high resistivity material by additional processing. For example, the cross-section structural diagram of FIG. 5 shows the EOS protection device 12 after using an ion implant process to convert the transformed region 26 to a relatively higher resistivity material for increased isolation. FIG. 6 depicts the EOS protection device 12 with the transformed region 26 expanded to include areas beyond the first contact 14 and the second contact 16.

Figure 7:
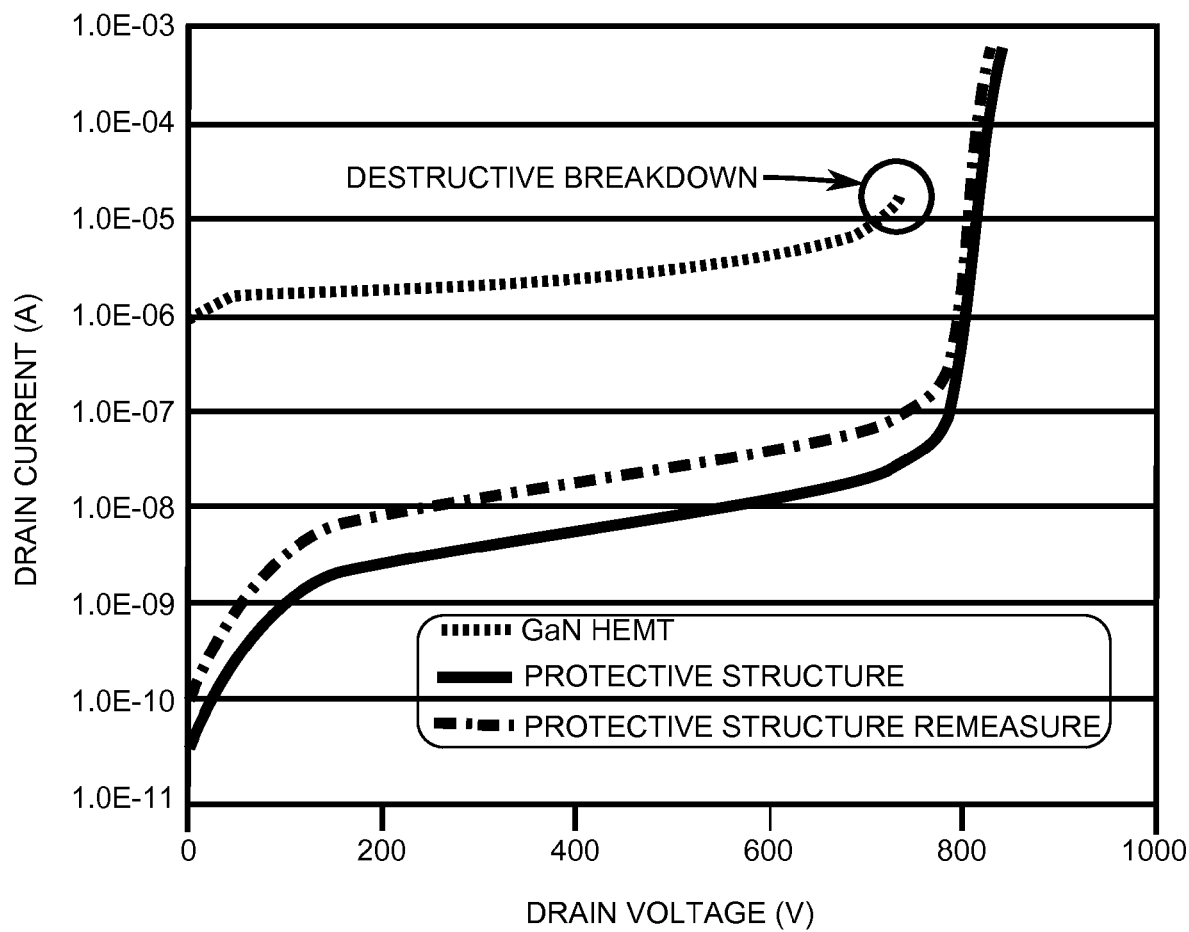
FIG. 7 is a graph showing DRAIN CURRENT (A) vs. DRAIN VOLTAGE (V) for an EOS protection structure and a gallium high electron mobility transistor (GaN HEMT) in an off-state due to an applied gate voltage that is less than a threshold voltage.

An exemplary version of the semiconductor device 10 shown in FIG. 5 has been fabricated on GaN epitaxial layers that were grown on a semi-insulating SiC substrate. FIG. 7 is a graph that shows DRAIN CURRENT (A) vs. DRAIN VOLTAGE (V) for a GaN HEMT in an off-state due to an applied gate voltage that is less than a threshold voltage, wherein the EOS protection device 12 and the semiconductor device 10 share space on a wafer (not shown). Notice that a drain curve for a GaN HEMT represented by a dashed line exhibits an abrupt and destructive voltage breakdown above 700V. In contrast, the EOS protection device 12 is able to carry almost 100× more breakdown current represented by a solid line and does not exhibit a destructive voltage breakdown as evidenced by a drain curve remeasure represented by a dotted and dashed line. In a preferred embodiment of the EOS protection device 12, the gap X in FIG. 3 is adjusted such that the EOS protection device 12 triggers before the destructive breakdown of the GaN HEMT.

Figure 8:
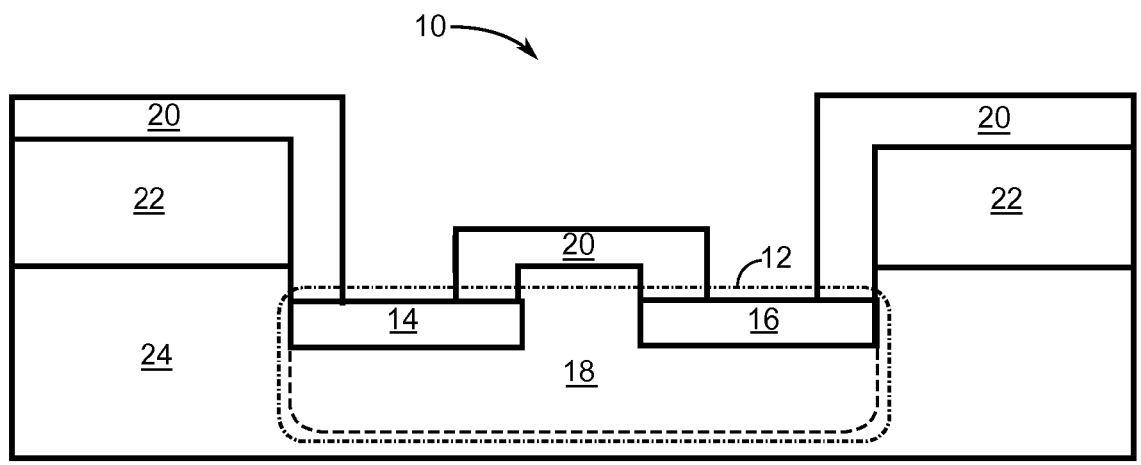
FIG. 8 is a cross-section structural diagram of an embodiment of the semiconductor device wherein the first contact and the second contact are recessed into the substrate.

FIG. 8 is a cross-section structural diagram of an embodiment of the semiconductor device 10 wherein the first contact 14 and the second contact 16 are recessed into the substrate 24. In this particular case, the semi-insulating region 18 of the EOS protection device 12 is located inside the substrate 24.

Figure 9:
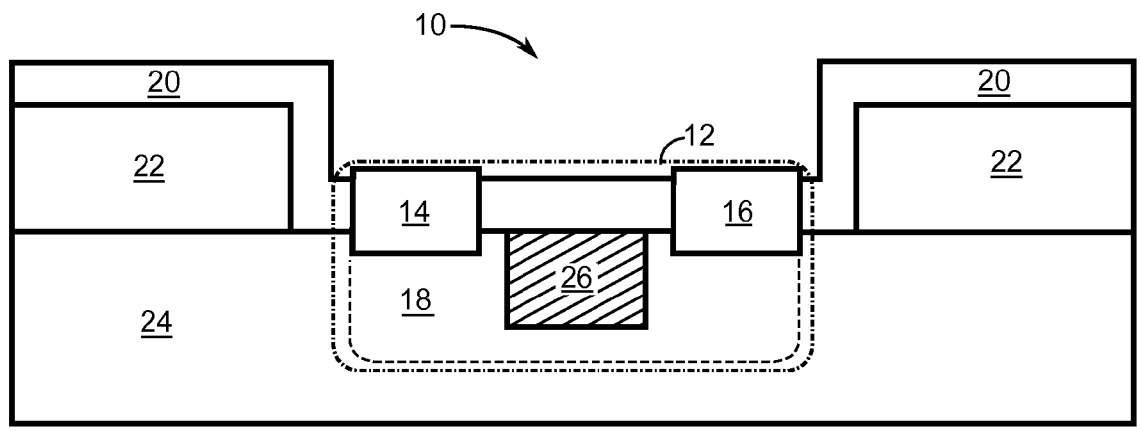
FIG. 9 is a cross-section structural diagram of an embodiment of the semiconductor device with the transformed region being located between the first contact and the second contact of the EOS protection device.

FIG. 9 is a cross-section structural diagram of an embodiment of the semiconductor device 10 with the transformed region 26 being located between the first contact 14 and the second contact 16 of the EOS protection device 12. Similar to the embodiment of FIG. 4, the transformed region 26 has been ion implanted with argon, boron, silicon, phosphorus, arsenic, gallium, aluminum, nitrogen, or other common implant species. The ion implant forms a damaged region in the substrate 24 and may or may not result in conversion of the region to a negative n-type or a positive p-type conductivity region.

Figure 10:
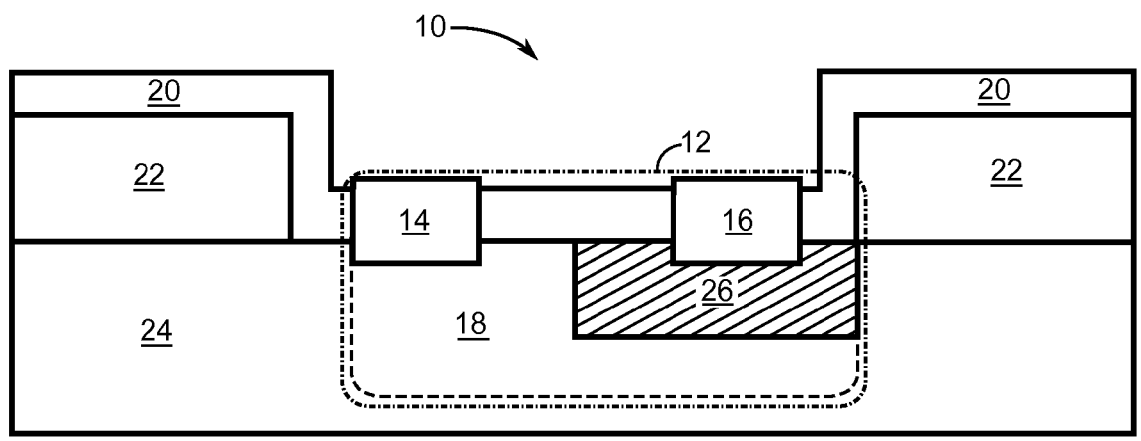
FIG. 10 is a cross-section structural diagram of an additional embodiment of the semiconductor device in which either the first contact or the second contact overlaps the transformed region.

FIG. 10 is a cross-section structural diagram of an additional embodiment of the semiconductor device 10 in which either the first contact 14 or the second contact 16 overlaps the transformed region 26. In this particular case, the transformed region 26 is depicted as completely overlapping the second contact 16. However, it is to be understood that the transformed region 26 can be implanted with ions such that either the first contact 14 or the second contact 16 only partially overlaps the transformed region 26. As with the other embodiments described above, the semi-insulating region 18 of the EOS protection device 12 protects the semiconductor device 10 by avalanching, leaking, or breaking down before the semiconductor device 10 is damaged.

Figure 11:
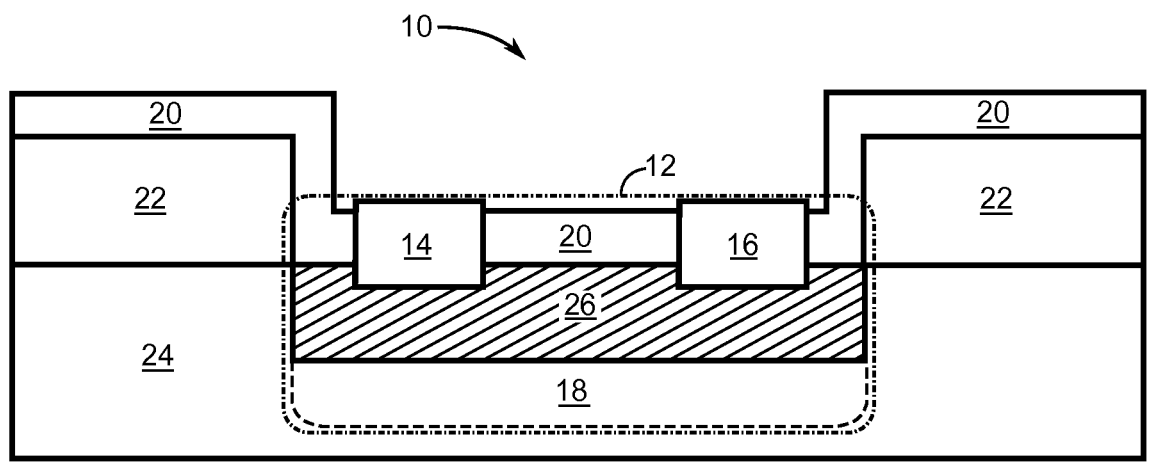
FIG. 11 is a cross-section structural diagram of an additional embodiment of the semiconductor device in which the first contact and the second contact overlap the transformed region.

FIG. 11 is a cross-section structural diagram of an additional embodiment of the semiconductor device 10 in which both the first contact 14 and the second contact 16 overlap the transformed region 26. In this particular case, the first contact 14 and the second contact 16 are depicted as completely overlapping the transformed region 26. However, it is to be understood that the transformed region 26 can be implanted with ions such that either or both of the first contact 14 or the second contact 16 only partially overlap the transformed region 26.

Figure 12:
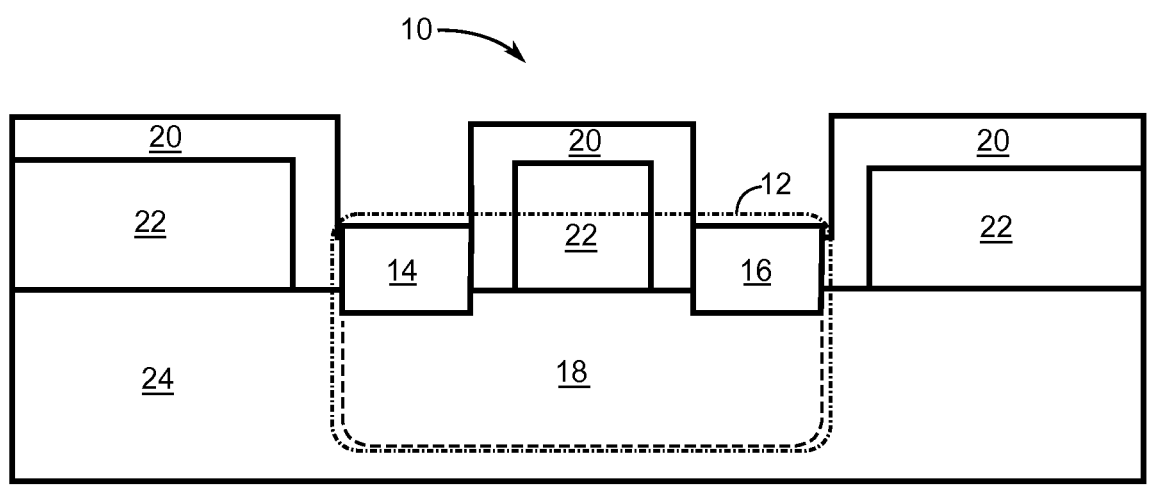
FIG. 12 is a cross-section structural diagram of yet another embodiment of the semiconductor device in which an epitaxial layer extends between the first contact and the second contact.

FIG. 12 is a cross-section structural diagram of yet another embodiment of the semiconductor device 10 in which the first contact 14 and the second contact 16 are in contact with the substrate 24. However, in this exemplary case, the epitaxial layer 22 extends between the first contact 14 and the second contact 16. The semi-insulating region 18 is confined to the substrate 24.

Figure 13:
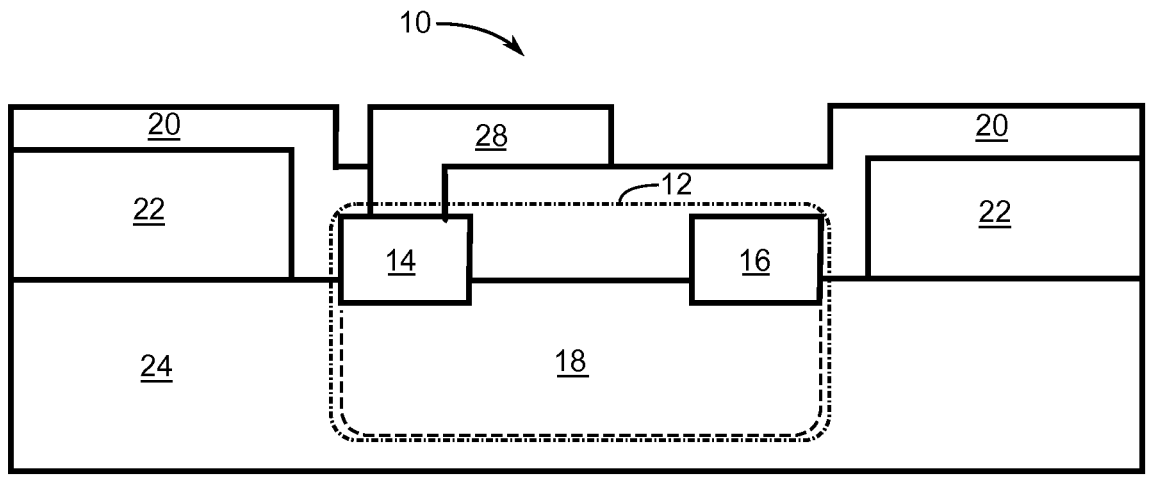
FIG. 13 is a cross-section structural diagram of an embodiment of the semiconductor device that includes a field plate for further protecting the semiconductor device from an EOS event.

FIG. 13 is a cross-section structural diagram of still another embodiment of the semiconductor device 10. This particular embodiment includes a field plate 28 for further protecting the semiconductor device 10 from an EOS event. As a result of the field plate 28, a protective breakdown voltage value for the EOS protection device 12 can be increased.

Figure 14:
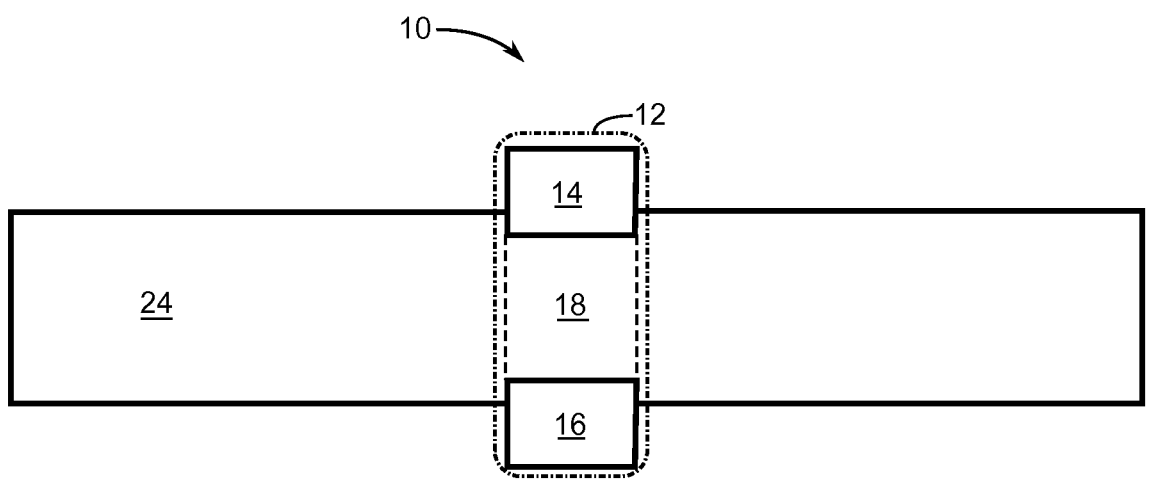
FIG. 14 is a cross-section structural diagram of an embodiment of the semiconductor device in which the first contact and the second contact are on opposing sides of the substrate.
Figure 15:
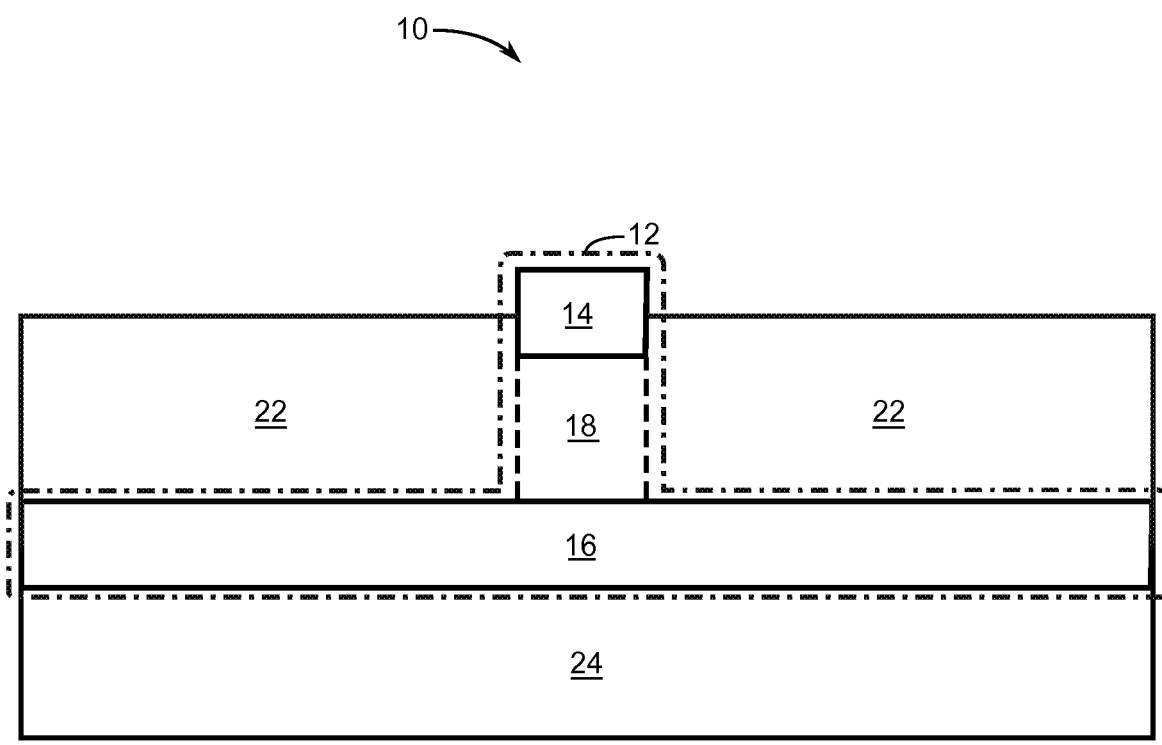
FIG. 15 is a cross-section structural diagram of an embodiment of the semiconductor device in which the first contact and the second contact are on opposing sides of an epitaxial layer disposed on the substrate.

FIG. 14 is a cross-section structural diagram of an embodiment of the semiconductor device 10 in which the first contact 14 and the second contact 16 are on opposing sides of the substrate 24. In this exemplary embodiment, the EOS protection device 12 extends perpendicular to and through the substrate 24. As a result, the semi-insulating region 18 extends substantially across the substrate 24. In this exemplary embodiment, the substrate 24 and the semi-insulating region 18 are both made of SiC. However, it is to be understood that the semi-insulating region 18 or at least a portion of the semi-insulating region 18 may be ion implanted to realize the transformed region 26 (FIGS. 5, 6, 9, 10 and 11). FIG. 15 is a cross-section structural diagram of yet another embodiment wherein the semi-insulating region 18 with opposing first contact 14 and second contact 16 is formed in the epitaxial layer 22.

Figure 16:
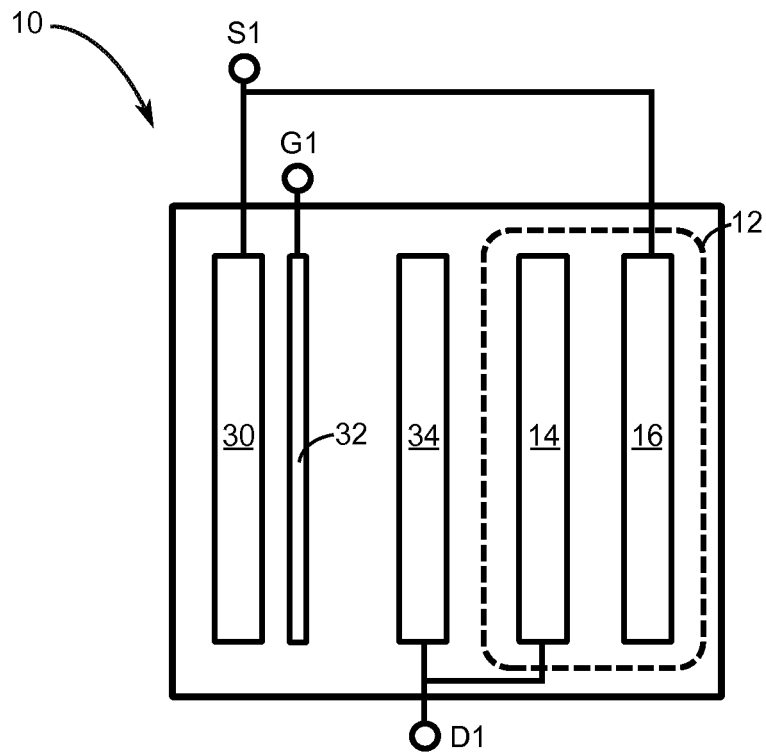
FIG. 16 shows a plan view schematic of one possible device layout which shows the semiconductor device in the form of a one gate finger GaN HEMT that includes the EOS protection device.
Figures 17, 18:
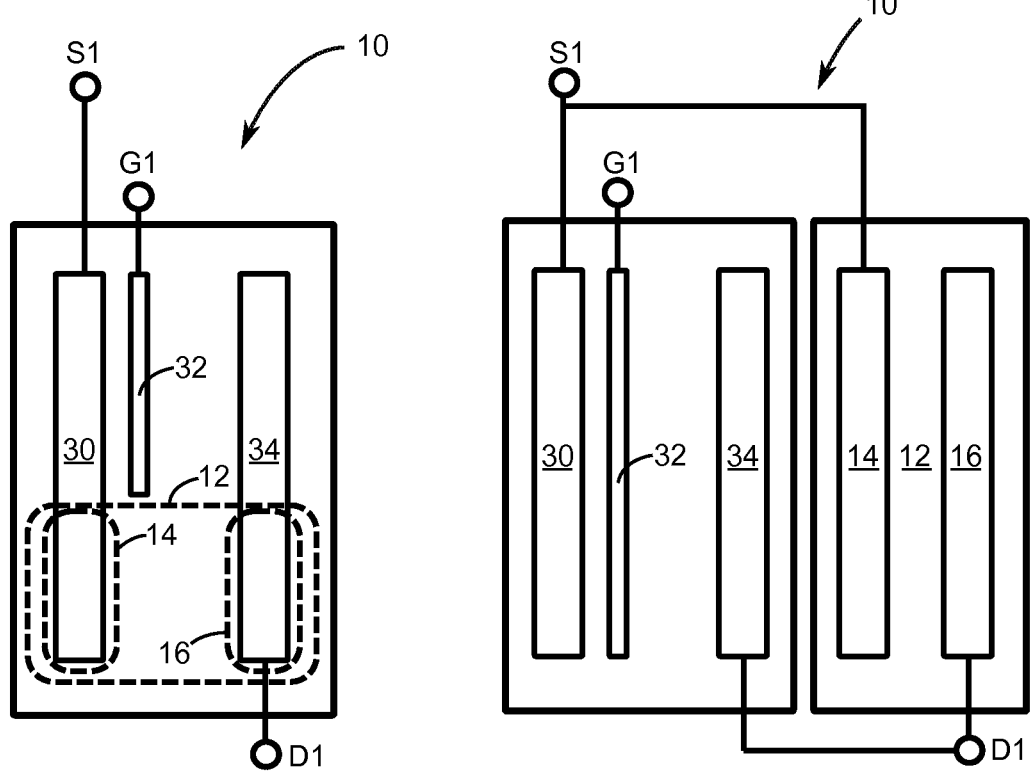
FIG. 17 shows another embodiment in which the semiconductor device in the form of a one gate finger GaN HEMT and the EOS protection device share the first contact and the second contact.
FIG. 18 is a plan view schematic illustrating that the semiconductor device and the EOS protection device can be located on separate chips.

FIG. 16 shows a plan view schematic of one possible device layout which shows the semiconductor device 10 having a source 30, a gate 32, and a drain 34 in the form of a one gate finger GaN HEMT that includes the EOS protection device 12. In this embodiment, the one gate finger GaN HEMT and the EOS protection device 12 do not share any contacts. Note that practical GaN HEMTs typically have many gate fingers and could have a plurality of EOS protection devices such as EOS protection device 12 integrated within an active area of the GaN HEMT. FIG. 17 shows another embodiment in which the semiconductor device 10 in the form of a one gate finger GaN HEMT and the EOS protection device 12 device share the first contact 14 and the second contact 16. It is also possible to share only one of the first contact 14 and the second contact 16. Furthermore, FIG. 18 is a plan view schematic illustrating that the semiconductor device 10 and the EOS protection device 12 can be located on separate chips. It is to be understood that the structural layout of the EOS protection device 12 can be linear or annular. Moreover, it is not required that the epitaxial layer 22 be present in the EOS protection device 12, and the EOS protection device 12 can also be located on a backside of a wafer and connected to the semiconductor device 10 using wafer vias.

Those skilled in the art will recognize improvements and modifications to the embodiments of the present disclosure. All such improvements and modifications are considered within the scope of the concepts disclosed herein and the claims that follow.

What is claimed is:

1. A semiconductor device with electrical overstress (EOS) protection comprising:
   a semiconductor element having a gate, an input terminal, and an output terminal; and
   an EOS protection device comprising;
   a semi-insulating layer;
   a first contact embedded in the semi-insulating layer and coupled to the input terminal;
   a second contact embedded in the semi-insulating layer and coupled to the output terminal; and
   a passivation layer disposed directly onto the semi-insulating layer such that opposing vertical sides of the first contact and the second contact directly abut both the passivation layer and the semi-insulating layer while leaving the first contact and the second contact uncovered with a gap between the first contact and the second contact set to provide a predetermined avalanche breakdown voltage level and wherein a dielectric strength of the passivation layer is greater than that of the semi-insulating layer to ensure that an avalanche voltage breakdown occurs at the predetermined avalanche breakdown voltage level within the semi-insulating layer within a semi-insulating region between the first contact and the second contact before a voltage breakdown can occur in the passivation layer, wherein the semi-insulating region is laterally spaced from the gate such that the gate does not overlap the semi-insulating region.

2. The semiconductor device of claim 1 wherein a predetermined resistivity of the semi-insulating region prevents leakage current from rising to a level greater than an intrinsic drain-to-source leakage of the semiconductor device being protected.

3. The semiconductor device of claim 1 further including an epitaxial layer disposed onto the semi-insulating layer.

4. The semiconductor device of claim 3 wherein the epitaxial layer extends between the first contact and the second contact.

5. The semiconductor device of claim 3 wherein the epitaxial layer is made of gallium nitride (GaN) and the semi-insulating layer is a substrate made of the same material as the semi-insulating region.

6. The semiconductor device of claim 1 further including a transformed region within the semi-insulating region.

7. The semiconductor device of claim 6 wherein the transformed region comprises implanted ions.

8. The semiconductor device of claim 7 wherein the implanted ions are selected from a group consisting of aluminum, argon, boron, silicon, phosphorus, arsenic, gallium, and nitrogen.

9. The semiconductor device of claim 6 wherein either the first contact or the second contact at least partially overlaps the transformed region.

10. The semiconductor device of claim 6 wherein both the first contact and the second contact at least partially overlap the transformed region.

11. The semiconductor device of claim 6 wherein neither of the first contact and the second contact overlaps the transformed region.

12. The semiconductor device of claim 1 further including at least one field plate coupled to at least the first contact or the second contact.

13. The semiconductor device of claim 1 wherein the first contact, the second contact, and the semi-insulating region comprise an EOS protection device in which at least one of the first contact and the second contact are co-located with the drain and source, respectively.

14. The semiconductor device of claim 1 wherein the first contact, the second contact, and the semi-insulating layer comprise an EOS protection device in which the first contact and the second contact are coupled to the drain and source, respectively, without sharing a common substrate.

15. The semiconductor device of claim 1 wherein the first contact, the second contact, and the semi-insulating layer comprise an EOS protection device that is located on a wafer backside that includes vias for coupling the first contact and the second contact to the drain and source, respectively.

16. The semiconductor device of claim 1 wherein the drain includes a plurality of drain fingers, the gate includes a plurality of gate fingers, and the source includes a plurality of source fingers.

17. The semiconductor device of claim 16 wherein a plurality of EOS protection devices each made of a first contact, a second contact, and a semi-insulating layer coupled between each of the drain fingers and source fingers, respectively.

18. The semiconductor device of claim 1 wherein the semiconductor device is a high voltage diode.

19. The semiconductor device of claim 1 wherein the first contact and the second contact are recessed within a substrate making up the semi-insulating layer.

20. The semiconductor device of claim 1 wherein the first contact and the second contact are in contact with and on opposing vertical sides of a substrate making up the semi-insulating layer.

21. The semiconductor device of claim 1 wherein the first contact and the second contact are in contact with opposing vertical sides of an epitaxial layer making up the semi-insulating layer.

* * * * *